US011869566B2

(12) United States Patent
Mentovich et al.

(10) Patent No.: US 11,869,566 B2
(45) Date of Patent: Jan. 9, 2024

(54) MEMORY CELL BASED ON SELF-ASSEMBLED MONOLAYER POLARON

(71) Applicant: MELLANOX TECHNOLOGIES, LTD., Yokneam (IL)

(72) Inventors: Elad Mentovich, Tel Aviv (IL); Itshak Kalifa, Bat Yam (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 134 days.

(21) Appl. No.: 17/394,515

(22) Filed: Aug. 5, 2021

(65) Prior Publication Data
US 2023/0041969 A1   Feb. 9, 2023

(51) Int. Cl.
| | | |
|---|---|---|
| G11C 11/40 | (2006.01) | |
| G11C 11/404 | (2006.01) | |
| G11C 11/4096 | (2006.01) | |
| H10K 10/46 | (2023.01) | |
| H10K 85/20 | (2023.01) | |

(52) U.S. Cl.
CPC ........ *G11C 11/404* (2013.01); *G11C 11/4096* (2013.01); *H10K 10/484* (2023.02); *H10K 10/491* (2023.02); *H10K 85/211* (2023.02)

(58) Field of Classification Search
CPC . G11C 11/404; G11C 11/4096; H10K 85/211; H10K 10/484; H10K 10/491
See application file for complete search history.

(56) References Cited

U.S. PATENT DOCUMENTS

| | | | |
|---|---|---|---|
| 6,844,567 B2 | 1/2005 | Talroze et al. | |
| 2009/0021984 A1* | 1/2009 | Wang | G11C 8/08 365/185.18 |
| 2010/0140589 A1 | 6/2010 | Ionescu | |
| 2012/0241713 A1* | 9/2012 | Nishizawa | H10K 85/311 257/4 |

(Continued)

FOREIGN PATENT DOCUMENTS

KR    20000034979 A  *  6/2000  ......... G11C 13/0014

OTHER PUBLICATIONS

Richter et al., "Realization of Molecular-Based Transistors," Research News, Advanced Materials, vol. 30, issued 41, pp. 1-7, Oct. 11, 2018.

*Primary Examiner* — Tuan T Nguyen
(74) *Attorney, Agent, or Firm* — Kligler & Associates Patent Attorneys Ltd.

(57) ABSTRACT

A memory device includes a memory cell and a controller. The memory cell includes: (a) an array of molecule chains, at least one molecule chain includes: (i) first and second binding sites positioned at first and second ends of the molecule chain, respectively, and (ii) a chain of one or more fullerene derivatives, chemically connecting between the first and second binding sites, (b) source and drain electrodes, electrically connected to the first and second binding sites, respectively, and configured to apply to the array a source-drain voltage (VSD) along a first axis, and (c) a gate electrode, configured to apply to the array a gate voltage (VG) along a second different axis. The controller is configured to perform a data storage operation in the memory cell by (i) applying to the gate electrode a signal for producing the VG, and (ii) applying the VSD between the source and drain electrodes.

28 Claims, 3 Drawing Sheets

(56) References Cited

U.S. PATENT DOCUMENTS

2014/0231897 A1* 8/2014 Terai .................... H01L 29/792
                                                            257/324
2016/0284868 A1* 9/2016 Terai ................. H01L 21/02282

* cited by examiner

MEMORY CELL BASED ON SELF-ASSEMBLED MONOLAYER POLARON

FIELD OF THE INVENTION

The present invention relates generally to memory devices, and particularly to memory devices based on a self-assembled monolayer of polaron and methods for producing and using thereof.

BACKGROUND OF THE INVENTION

Polarons and polaronic effects are used in various types of electronic devices.

For example, U.S. Pat. No. 6,844,567 describes quantum nanowires produced in a medium comprising ions, dopants and free electrons. The free electrons are solvated by complexes of ions and dopants. Electrical conductivity of the quantum nanowires can be higher than for conventional metal conductors. Quantum nanowires can be prepared in linear or circular form, and can be used to manufacture electrical components including transistors, sensors, motors and other nanoscale passive or active devices. The devices can be used in the manufacture of computers, electronic circuits, biological implants and other products.

U.S. Patent Application Publication 2010/140589 describes a Ferroelectric tunnel FET switch as ultra-steep (abrupt) switch with subthreshold swing better than the MOSFET limit of 60 mV/decade at room temperature. The switch combining two key principles: ferroelectric gate stack and band-to-band tunneling in gated p-i-n junction. The ferroelectric material included in the gate stack creates, due to dipole polarization with increasing gate voltage, a positive feedback in the capacitive coupling that controls the band-to-band (BTB) tunneling at the source junction of a silicon p-i-n reversed bias structure.

SUMMARY OF THE INVENTION

An embodiment of the present invention that is described herein provides a memory device, including a memory cell and a controller. The memory cell includes: (a) an array of one or more molecule chains, at least one of the molecule chains including: (i) first and second binding sites positioned at first and second ends of the molecule chain, respectively, and (ii) a chain of one or more fullerene derivatives, chemically connecting between the first and second binding sites, (b) a source electrode and a drain electrode, which are electrically connected to the first and second binding sites, respectively, and are configured to apply to the array a source-drain voltage (VSD) along a first axis, and (c) a gate electrode, which is configured to apply to the array a gate voltage (VG) along a second axis, different from the first axis. The controller is configured to perform a data storage operation in the memory cell by (i) applying to the gate electrode a signal for producing the VG, and (ii) applying the VSD between the source and drain electrodes.

In some embodiments, at least one of the binding sites includes a thiol or a carboxyl group bonded to one or more titanium-oxide or aluminum oxide compounds. In other embodiments, at least one of the fullerene derivatives includes a C60 fullerene having a polyhedral carbon structure. In yet other embodiments, the array of the one or more molecule chains includes a self-assembled monolayer (SAM).

In an embodiment, the controller is configured to write a data value to the memory cell, or to erase the data value from the memory cell, by changing a phase of at least part of the SAM. In another embodiment, the molecules of the array are interconnected by chemically connecting between adjacent molecule chains of the SAM. In yet another embodiment, the controller is configured to write or refresh a data value in the memory cell by (i) applying a given VG and (ii) applying the VSD that is larger than a defined threshold of the VSD.

In some embodiments, the controller is configured to read the data value from the memory cell by (i) applying the given VG, (ii) applying the VSD that is smaller than the defined threshold of the VSD, and (iii) measuring a current indicative of the data value written in the memory cell. In other embodiments, at least one of the molecule chains in the array has a hysteresis loop, and when applying the given VG: (i) in response to writing or refreshing the data value, the molecule chain assumes a first phase and the measured current assumes a first value, and (ii) without writing or refreshing the data value, the molecule chain assumes a second phase different from the first phase, and the measured current assumes a second value, smaller than the first value. In yet other embodiments, the controller is configured to erase the data value from the memory cell by applying (i) the VG having a polarity opposite to that of the given VG, or (ii) the VSD having a polarity opposite to that of the VSD used for the writing or the refreshing.

In an embodiment, the controller is configured to apply the VG to the gate electrode using a light beam or an electrical voltage. In another embodiment, the chain includes a predefined number of the fullerene derivatives, and the predefined number is configured to determine an operational frequency of the memory device.

In some embodiments, the memory cell includes one or more additional arrays of the one or more molecule chains, each of the additional arrays is electrically connected to the source electrode and to the drain electrode, and the controller is configured to perform the data storage operation in (i) the array and (ii) the one or more additional arrays at a same time. In other embodiments, a number of the one or more additional arrays determines a memory capacity of the memory cell.

There is additionally provided, in accordance with an embodiment of the present invention, a method including: in a memory cell that includes: (a) an array of one or more molecule chains, at least one of the molecule chains includes: (i) first and second binding sites positioned at first and second ends of the molecule chain, respectively, and (ii) a chain of one or more fullerene derivatives, chemically connecting between the first and second binding sites, (b) a source electrode and a drain electrode, which are electrically connected to the first and second binding sites, respectively, for applying to the array a source-drain voltage (VSD) along a first axis, and (c) a gate electrode for applying to the array a gate voltage (VG) along a second axis, different from the first axis, applying to the gate electrode a signal for producing the VG. A data storage operation is performed in the memory cell by applying the VSD between the source and drain electrodes.

There is further provided, in accordance with an embodiment of the present invention, a method for producing a memory cell, the method includes: forming an array of one or more molecule chains, at least one of the molecule chains including: (i) first and second binding sites positioned at first and second ends of the molecule chain, respectively, and (ii) a chain of one or more fullerene derivatives, chemically connecting between the first and second binding sites. A source electrode and a drain electrode, which are electrically connected to the first and second binding sites, respectively, are formed for applying to the array a source-drain voltage (VSD) along a first axis. A gate electrode is formed for applying to the array a gate voltage (VG) along a second axis, different from the first axis.

The present invention will be more fully understood from the following detailed description of the embodiments thereof, taken together with the drawings in which:

DETAILED DESCRIPTION OF EMBODIMENTS

Overview

Figure 1:
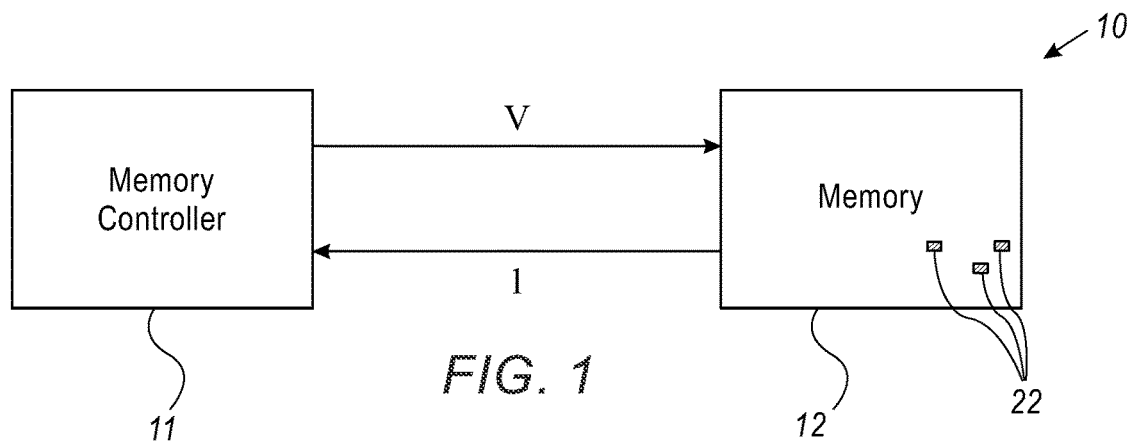
FIG. 1 is a block diagram that schematically illustrates a memory device, in accordance with an embodiment of the present invention.

Embodiments of the present invention that are described hereinbelow provide a memory device, which is based on one or more transistors comprising a polaronic switching material described in detail below. In some embodiments, the memory device comprises a memory cell and a controller, which is configured to perform data storage operations in the memory cell.

In some embodiments, the memory cell comprises a self-assembled monolayer (SAM) made from multiple linear molecule chains (MCs) coupled together and typically arranged in an array. Each MC comprises a molecule configured to assume at least two controllable material phases. In the context of the present disclosure, the terms "phase" and "material phase" refer to an arrangement of the molecule elements in two or more predefined configurations, each configuration resulting in different respective properties (e.g., mechanical, electrical, magnetic) of the material. More specifically, the ability to control the phase of the molecule by applying voltage is also referred to herein as a "polaronic effect," and such a molecule is also referred to herein as a "polaron." In the context of the present disclosure, the molecule is also referred to herein as a memory molecule (MM) whose structure and functionality are described in detail below.

In some embodiments, the two ends of each MM are chemically connected to two binding sites, respectively. In the present example, each MM comprises one or more fullerene derivatives, such as C60-based fullerenes, and each binding site comprises a thiol, or a carboxyl group connected to aluminum oxide or titanium oxide.

In some embodiments, the memory cell comprises a source electrode and a drain electrode, which are electrically connected to the binding sites, and are configured to apply to the SAM a source-drain voltage (VSD) along a first axis of the array. In the present example, the VSD is applied along a longitudinal axis of the MMs.

In some embodiments, the memory cell comprises a gate electrode configured to apply to the array a gate voltage (VG) along a second axis of the array, different from the first axis. In the present example, the VG is applied orthogonally to the longitudinal axis of the MMs. Note that the memory cell has a structure of a transistor having the SAM positioned (i) between the source and drain electrodes, and (ii) in close proximity to the gate electrode.

In some embodiments, the controller is configured to apply a signal to the gate electrode for producing an intended value of the VG. The signal may comprise voltage, a laser beam, or any other suitable type of signal.

In some embodiments, the transistor is configured to serve as a memory cell by applying preassigned VG and VSD for controlling the phase of the SAM. In the present example, the SAM (and each MM thereof) is configured to assume: (i) a first stable phase when no voltage is applied thereto (also referred to herein as Voff), and (ii) a second stable phase when applying a predefined voltage to the SAM (also referred to herein as Von). Note that when applying a voltage between Voff and Von, the SAM is unstable and assumes one of the first or second phases. In the present configuration, the value of Von may be adjusted by applying the VG to the SAM via the gate electrode, as will be described in detail below.

In some embodiments, when applying suitable VG and VSD to the transistor of the memory cell, at least one of the MCs, and typically the entire SAM, exhibits the polaronic effect that results in a hysteresis loop of a voltage-current characteristic. In other words, when applying a given VG and a preassigned VSD (between Voff and Von), the current measured in the memory cell is indicative of the present phase of the SAM. For example, when the SAM (or at least one of the SAM's memory molecules) assumes a first phase, the measured current assumes a first value, and when the SAM assumes a second phase, the measured current assumes a second value, e.g., larger than the first value.

In some embodiments, based on the polaronic effect, the controller is configured to perform data storage operations in the memory cell, such as reading, writing, erasing and refreshing of one or more data values. The type of data storage operation is defined by: (i) a preassigned VG applied to the SAM by the gate electrode, and (ii) a preassigned VSD applied between the source electrode and the drain electrode.

In some embodiments, the controller is configured to write or refresh a data value in the memory cell by (i) applying a given VG, and (ii) applying the VSD that is larger than a defined threshold of the VSD. This operation is also referred to herein as a "gate on" operation. In such embodiments, the applied VSD and given VG change the phase of at least part of the SAM (for a predefined time interval described in FIG. 4 below), and thereby, enable to write or refresh the data value in the memory cell.

In some embodiments, the controller is configured to read the data value from the memory cell by (i) applying the given VG, (ii) applying the VSD that is smaller than the defined threshold of the VSD, and (iii) measuring the current, which is indicative of the data value written in the memory cell. This operation is also referred to herein as a "gate standby" operation. Note that in the reading operation, the phase of the SAM is retained (for the predefined time interval) and the measured current is indicative of the present phase of the SAM.

In some embodiments, the controller is configured to erase the data value from the memory cell by applying (i) a different VG, e.g., a VG having a polarity opposite to that of the given VG, or (ii) a different VSD, e.g., a VSD having a polarity opposite to that of the VSD used for the writing or refreshing. This operation is also referred to herein as a "gate off" operation. Note that in the gate off operation, the phase of the SAM is altered.

The disclosed techniques enable a novel type of a capacitor-less memory cell, which is scalable: (i) in capacity (e.g., by controlling the number of molecule chains in the SAM), and (ii) in operational frequency (e.g., by controlling the length of each molecule chain). Moreover, the disclosed memory cell may be implemented in any suitable type of vertical or horizontal transistor structure, such as in fin-FET (field-effect transistor), and in gate-all-around (GAA) transistors based on nano-wires or nano-sheets.

System Description

FIG. 1 is a block diagram that schematically illustrates a memory device 10, in accordance with an embodiment of the present invention.

In some embodiments, memory device (MD) 10 comprises a memory controller, also referred to herein as a controller 11 for brevity, and a memory 12, which is configured to store data values. Memory 12 comprises one or more memory cells 22, whose structure and functionality are described in detail in FIGS. 2 and 3 below.

In some embodiments, controller 11 comprises a general-purpose controller, which is programmed in software to carry out the functions described herein. The software may be downloaded to the controller in electronic form, over a network, for example, or it may, alternatively or additionally, be provided and/or stored on non-transitory tangible media, such as magnetic, optical, or electronic memory.

In some embodiments, controller 11 and memory cells 22 of memory 12 are configured to exchange signals, so as to carry out data storage operations, such as reading, writing, refreshing and erasing of data value(s) in one or more of memory cells 22. In the present example, controller 11 is configured to: (i) apply several types of voltage, such as gate voltage (VG) and source/drain voltage (VSD), to respective electrodes of a given memory cell 22, and (ii) measure currents indicative of the storage status of data values in given memory cell 22, as will be described in detail, for example, in FIGS. 2-4 below.

Memory Cell Based on Polaronic Effect

Figure 2:
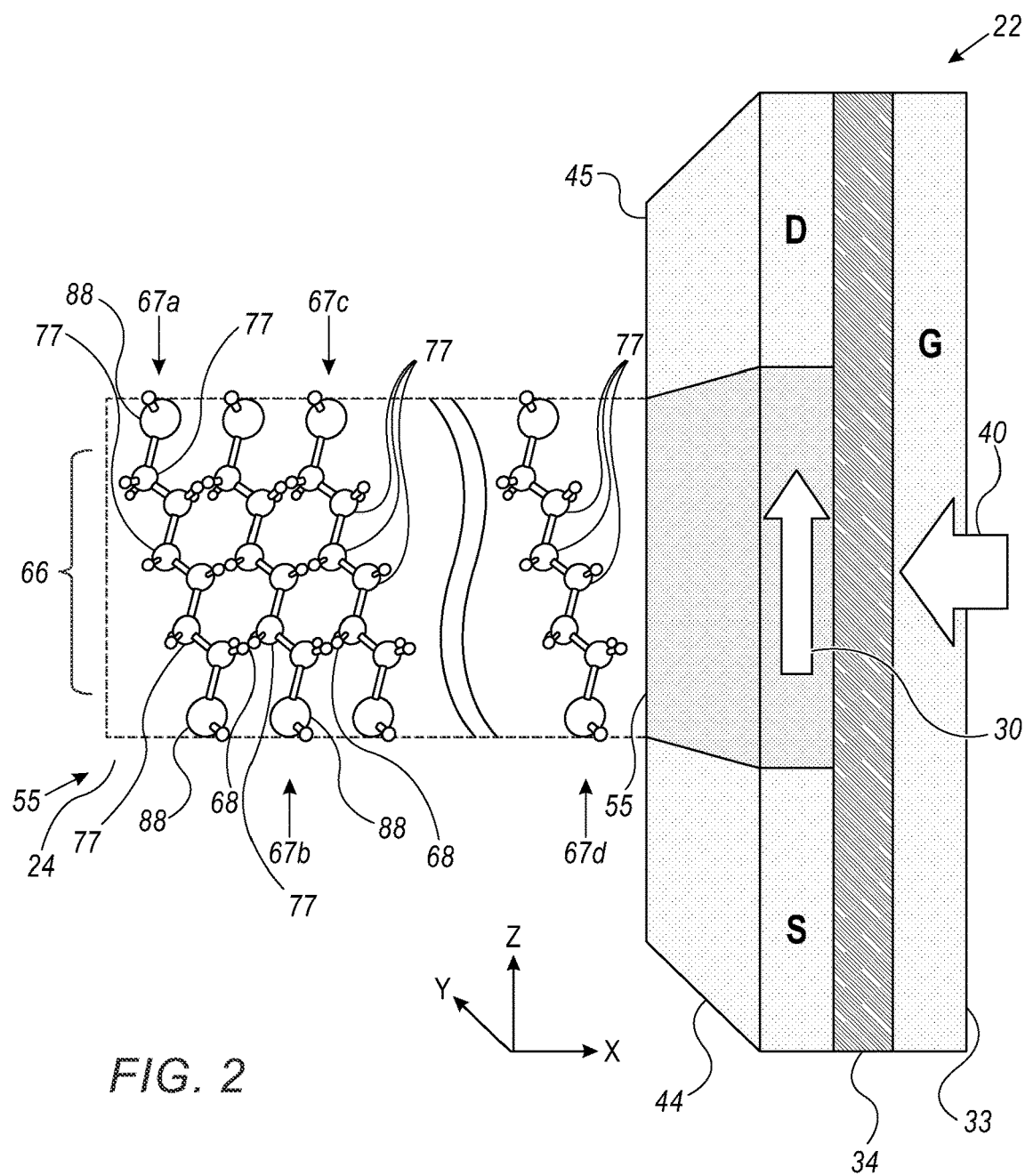
FIG. 2 is a schematic pictorial illustration of a memory cell implemented in a vertical transistor of the memory device, in accordance with an embodiment of the present invention.

FIG. 2 is a schematic pictorial illustration of memory cell 22 implemented in a vertical transistor of memory 12, in accordance with an embodiment of the present invention. In the present example, memory cell 22 is implemented in a vertical transistor of memory 12, but in other embodiments, the techniques described herein may be used, mutatis mutandis, for implementing memory cell 22 in any other sort of horizontal or vertical transistor. For example, in a vertical fin field-effect transistor (finFET), in a horizontal metal-oxide-semiconductor FET (MOSFET) transistor, in a vertical gate-all-around (GAA) transistor, which is based on nano-wires or nano-sheets, or in any other suitable structure.

In some embodiments, memory cell 22 comprises a gate electrode 33 made from doped silicon, aluminum or titanium/titanium alloy or from any other suitable electrically-conductive substance. Gate electrode 33 is formed over a gate dielectric layer (GD) 34 made from silicon-dioxide ($SiO_2$) or titanium-dioxide ($TiO_2$) or from any other suitable type of dielectric material.

In some embodiments, memory cell 22 comprises a source electrode and a drain electrode, also referred to herein as a source 44 and a drain 45, respectively. In some embodiments, source 44 and drain 45 have a similar structure, and are defined based on the polarity of memory cell 22. In the example of FIG. 2, the VSD is applied along a direction 30 parallel to a Z-axis of an XYZ coordinate system of memory cell 32, so that source 44 and drain 45 are defined accordingly. Due to their similar structure, source 44 and drain 45 are also referred to herein as "S/D" and are typically made from any suitable type of electrically-conductive material, such as but not limited to palladium (Pd), gold (Au), aluminum (Al), titanium (Ti), copper (Cu), silicon with dopants, or from any suitable alloy thereof.

In some embodiments, memory cell 22 comprises a self-assembled monolayer (SAM) 55, formed between source 44 and drain 45 along the Z-axis, and placed in contact with GD 34. In some embodiments, controller 11 is configured to apply the VG, shown as an arrow in a direction 40, to gate electrode 33 using (i) an electrical voltage, or (ii) a light beam, such as a laser beam, or (iii) using any other suitable technique for producing the intended value of the VG. Controller 11 is further configured to apply the VSD (e.g., in direction 30) between source 44 and drain 45. In the present example, the directions of VG and VSD are orthogonal to one another, but in other embodiments, VG and VSD may be applied to memory cell 22 using any other suitable directions, typically different from one another.

Reference is now made to an inset 24 showing the molecular structure of SAM 55.

In some embodiments, SAM 55 is made from multiple molecule chains (MCs) 67 comprising multiple linear molecules, respectively, also referred to herein as memory molecules (MMs) 66. Each MM 66 comprises one or more fullerene derivatives (FDs) 77, such as but not limited to C60-based fullerenes integrated together in a serial form, e.g., along the Z-axis. The two ends of each MM 66 are chemically connected to two binding sites 88, respectively, so as to form MC 67. In the present example, at least one of and typically each binding site 88 comprises a thiol, or a carboxyl group that is attached to aluminum oxide or titanium oxide or to any other suitable material.

In some embodiments, FDs 77 of MMs 66 are arranged in a vertical configuration along the Z-axis of memory cell 22, so that SAM 55 also has a vertical configuration. In other embodiments, FDs 77 of MMs 66 may be arranged in any other suitable configuration, e.g., in a horizontal configuration along the Y-axis of memory cell 22, so that SAM 55 also has a horizontal configuration.

In some embodiments, SAM 55 comprises at least MCs 67a, 67b, 67c and 67d, which are integrated together in a serial form along the X-axis. In the present example, each pair of FDs 77 of adjacent MCs 67 is conjugated in a covalent bond 68, or in a Van der Walls bond, so that at least MCs 67a, 67b, 67c and 67d are arranged in SAM 55 as an array (e.g., a two-dimensional array).

In some embodiments, the number of (one or more) FDs 77 is typically similar in each MM 66, and defines the effective length (Leff) of the transistor along the Z-axis of memory cell 22.

In some embodiments, the number of MCs 67 in SAM 55 may define the size (e.g., width) of the transistor along the X-axis of memory cell 22, and therefore the memory capacity of each memory cell 22.

Figure 3:
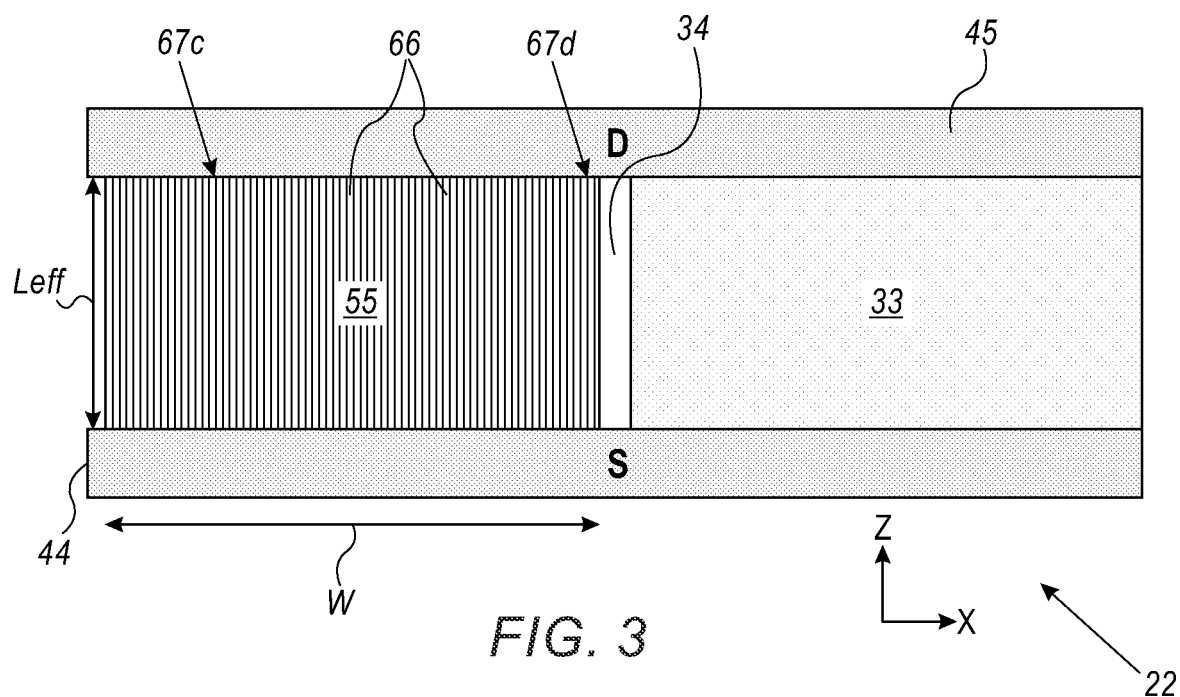
FIG. 3 is a sectional view of the memory cell, in accordance with an embodiment of the present invention.

In some embodiments, memory cell 22 may comprise any suitable number of self-assembled monolayers (SAMs) 55 produced along the Y-axis. Each SAM 55 is electrically connected to source 44 and drain 45 as described above for SAM 55. In the present example, all SAMs 55 may be positioned in parallel to one another along the Y-axis (as shown in FIG. 3 below), so that the number of SAMs 55 defined the width of memory cell 22, which may also define the memory capacity of memory cell 22, as described in detail in FIG. 3 below.

In some embodiments, the monolayer structure of SAM 55 shown in inset 24, comprises a slice of SAM 55 in an XZ plane of the transistor of memory cell 22, and is configured to store a predefined data value. In such embodiments, memory cell 22 may comprises a given number of SAMs 55, resulting in a corresponding given number of predefined data values stored in memory cell 22. In other words, the number of SAMs 55 affects the memory capacity of memory cell 22.

In some embodiments, the transistor of memory cell 22 is configured to be used for memory storage in response to applying preassigned VG and VSD for controlling the structure or configuration (also referred to herein as a phase) of SAM 55. The structure and controllable phase attribute of each MM 66 of MC 67, and of SAM 55 (in response to the applied voltage), is also referred to herein as a "polaron" or as a "negative u potential" material. In other words, the application of VG and VSD may or may not alter the arrangement of FDs 77 in SAM 55, i.e., the phase of SAM 55.

Note that phase transition of at least one MM 66 (and typically of SAM 55) may be used for writing or refreshing a data value in memory cell 22, or for erasing the data value from memory cell 22. Similarly, reading the data value may be carried out in memory cell 22 when a given phase of SAM 55 is retained.

In the present example, SAM 55 is configured to assume: (i) a first stable phase when VG and/or VSD are not applied thereto (also referred to herein as Voff shown in FIG. 4 below), and (ii) a second stable phase when applying a predefined voltage thereto (also referred to herein as Von shown in FIG. 4 below). When applying to S/D of memory cell 22 a voltage between Voff and Von, SAM 55 may exhibit a non-stable behavior and typically retains its present phase. The ability to control the phase of SAM 55 by applying voltage (e.g., VG and/or VSD) is also referred to herein as a polaronic effect.

In the present example, SAM 55 is formed such that the phase stability is maintained at room temperature or at any other suitable range of operational temperatures of the memory device.

In some embodiments, when applying the VSD, the value of Von (in which a phase transition occurs) may be adjusted by applying the VG to SAM 55 via gate electrode 33, as will be described in detail in FIG. 4 below.

In some embodiments, when applying to gate electrode 33 and to the S/D suitable VG and VSD, respectively, SAM 55 exhibits the polaronic effect that results in a hysteresis loop of a voltage-current characteristic shown in FIG. 4 below. In other words, when applying a given VG and a preassigned VSD between Voff and Von, the current measured in memory cell 22 is indicative of the present phase of SAM 55. For example, when SAM 55 assumes a first phase, the measured current assumes a first value, and when SAM 55 assumes a second different phase, the measured current assumes a second value, different from that of the first value.

In some embodiments, based on the polaronic effect, controller 11 is configured to perform data storage operations (e.g., reading, writing, erasing and refreshing data), in memory cell 22. The type of data-storage operation is determined by: (i) applying to gate electrode 33 a signal (e.g., voltage or laser beam) for producing a preassigned VG, and (ii) applying a preassigned VSD between source 44 and drain 45. The data storage operations are described in detail in FIG. 4 below.

In some embodiments, controller 11 can perform data storage operations in memory cell 22 only when at least one of VG and VSD is applied, respectively, to the gate and S/D electrodes of memory cell 22. In such embodiments, memory device 10 may be used as a volatile memory device, for example, as a dynamic random-access memory (DRAM) device. Note that memory cell 22 comprises a capacitor-less volatile RAM, also referred to in the semiconductor industry as a Z-RAM device.

In some embodiments, the polaronic effect and a selected number of FDs 77 in each MM 66, enable controllable switching time (e.g., between about 1 nanosecond (ns) and 1 microsecond (ms)) of the transistor of memory cell 22. Moreover, the number of MCs 67 in each SAM 55 may affect the capacity of memory cell 22. Based on these attributes and the scalability of SAM 55, memory device 10 may have improved performance compared to that of state-of-the-art devices. For example, the switching frequency of a 1T-DRAM, which is a state-of-the-art capacitor-less DRAM device, depends on the parasitic capacitance of the device, thus, 1T-DRAMs may operate at a maximal switching frequency smaller than about 10 GHz, whereas the typical switching frequency of a memory device based on memory cell 22 is about 100 GHz. Moreover, the scalable number of SAMs 55 in memory cell 22 may increase the memory capacity of memory cell 22, and therefore, may result in a reduced cost per stored data value.

In the context of the present disclosure and in the claims, the terms "about" or "approximately" for any numerical values or ranges indicate a suitable dimensional tolerance that allows the part or collection of components to function for its intended purpose as described herein.

This particular configuration of memory cell 22 is shown by way of example, in order to illustrate certain problems that are addressed by embodiments of the present invention and to demonstrate the application of these embodiments in enhancing the performance of such a memory cell and memory device. Embodiments of the present invention, however, are by no means limited to this specific sort of example transistor structure and memory cell and device, and the principles described herein may similarly be applied to other sorts of suitable transistors or other structures, memory cells and memory devices.

FIG. 3 is a sectional view of memory cell 22 in XZ plane, in accordance with an embodiment of the present invention. As described in FIG. 2 above, the size of MMs 66 along the Z-axis of SAM 55 is determined by the number of FDs 77 in each MM 66, and define the effective length (Leff) and switching time of the transistor of memory cell 22.

In some embodiments, the number of MMs 66 and MCs 67 arranged along the X-axis of SAM 55, defines the width (W) of the transistor of memory cell 22, and may determine the memory capacity of memory cell 22. For example, in case one SAM 55 is configured to store a memory bit, a memory cell 22 having about one million SAMs 55 is configured to store a memory of about 1 Mb. In such embodiments, controller 11 is configured to perform the aforementioned data storage operation in all SAMs 55 at the same time. Note that when applying suitable VG and VSD, the polaronic effect in MC 67d may be stronger than that in MC 67c. In such embodiments, the VG and VSD applied to the electrodes of memory cell 22 (as described in FIG. 2 above) may be adjusted, inter alia, based on both the Leff and the W of SAM 55.

In some embodiments, the value of VG and VSD for performing a desired data storage operation in memory cell 22 is also determined by the material type of FD 77 (e.g., C-60 fullerene) and the type of chemical connection (e.g., covalent bond 68) between FDs 77 of adjacent MCs 67.

In some embodiments, the length of each MC 67, and amount of MCs 67 in SAM 55, may determine the data storage attributes of memory device 10. More specifically, (i) the size of SAM 55 along the Z-axis (defined, inter alia, by the number of FDs 77 in each MC 67), affects the switching time and operational frequency of memory cell 22, and (ii) the size of SAM 55 along the X-axis (defined by the number of MCs 67 in SAM 55), affects the memory capacity of memory cell 22.

Performing Data Storage Operations in Memory Cell

Figure 4:
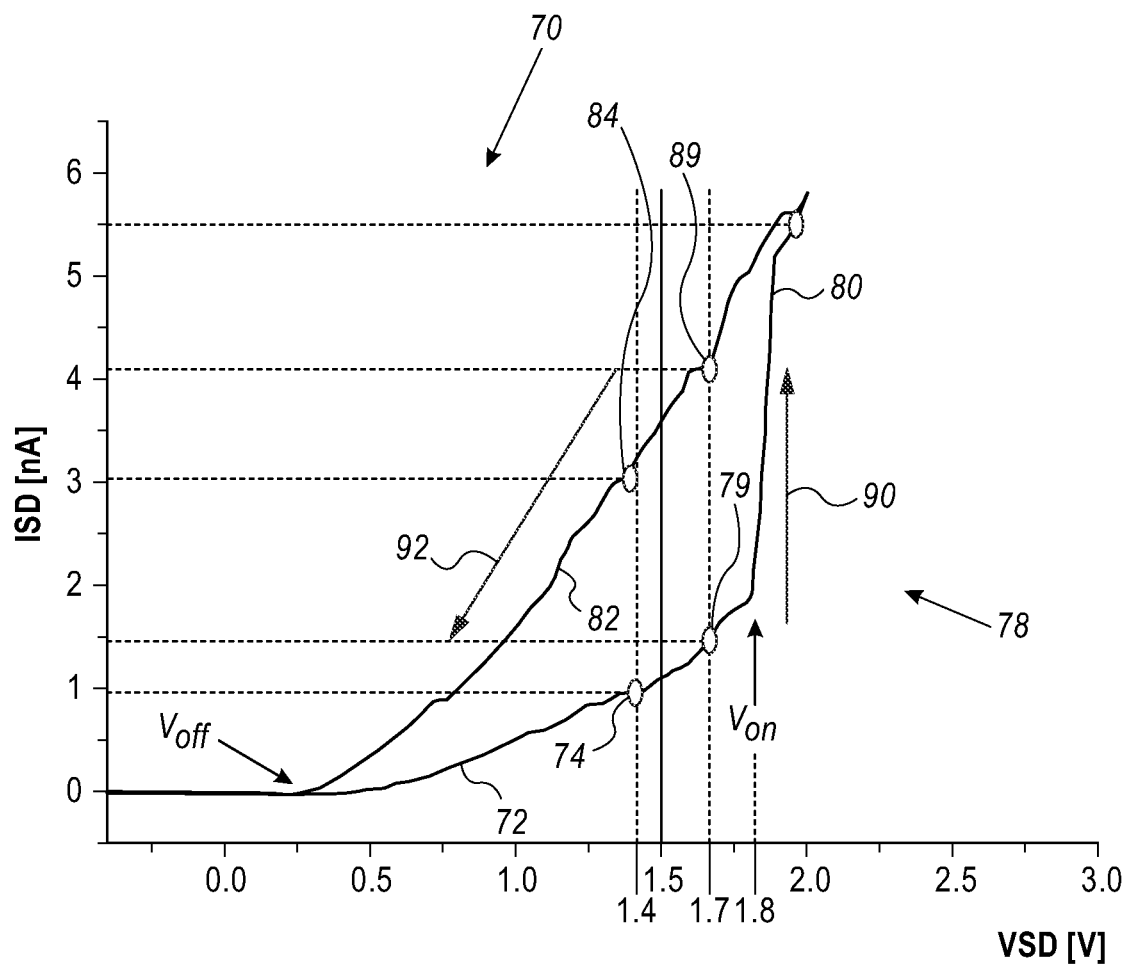
FIG. 4 is a graph of a measured current depending on a voltage applied to the memory cell for illustrating data storage operations performed in the memory cell, in accordance with an embodiment of the present invention.

FIG. 4 is a graph 70 of a current measured in S/D in response to a voltage applied to the S/D of memory cell 22 for illustrating data storage operations performed in memory cell 22, in accordance with an embodiment of the present invention.

In some embodiments, in addition to applying VG to gate electrode 33 as will be described below, controller 11 is configured to: (i) apply to the S/D a selected VSD measured in Volts (V), and responsively, (ii) measure current in the S/D, also referred to herein as "ISD" measured in Nano-Amperes (nA), so as to carry out data storage operations in memory cell 22, as will be described in detail below.

In the present example, graph 70 has a hysteresis loop 78 comprising sections 72, 80 and 82. At a Voff point, no VSD is applied to the SID, and therefore, no current is measured in memory cell 22, i.e., ISD equals about zero. Note that when VSD applied to SID equals about Voff, SAM 55 assumes the first phase described in FIG. 2 above.

In some embodiments, when controller 11 applies to S/D an increased VSD, which is larger than Voff and smaller than about 1.75 V, SAM 55 still assumes the first phase and the responsively-measured ISD increases as shown by section 72 of hysteresis loop 78. Note that when SAM 55 assumes the first phase, the ISD measured in the S/D in response to applying the VSD, is in accordance with section 72 of hysteresis loop 78. Subsequently, when controller 11 applies to the S/D VSD that equals to or larger than Von (i.e., about 1.8 V or a larger voltage), the responsively-measured ISD increases sharply, e.g., from about 1.7 nA to about 5 nA or 5.5 nA, as shown by section 80 of hysteresis loop 78. Note that the sharp increase of ISD is indicative of a phase transition in SAM 55, from the first phase to the second phase.

In some embodiments, after applying the Von, when controller 11 reduces the VSD applied to S/D, to a VSD smaller than Von, e.g., about 1.4 V, the responsively-measured ISD decreases. In the present example, the measured ISD is reduced to about 3 nA, as shown by section 82 of hysteresis loop 78. Note that when SAM 55 assumes the second phase, the ISD measured in response to applying the VSD, is in accordance with section 82 of hysteresis loop 78. Arrows 90 and 92 are indicative of the respective increase and decrease of the VSD applied by controller 11 to source 44 and drain 45 of memory cell 22.

In some embodiments, the ISD measured in S/D alters in response to the phase change in SAM 55. In the present example, when SAM 55 assumes a first phase (e.g., at a point 74 on section 72), and controller 11 applies to S/D a given VSD (e.g. about 1.4 V), the measured current assumes a first value (e.g., about 1 nA). When SAM 55 assumes a second different phase and controller 11 applies to S/D the given VSD of about 1.4 V (e.g., at a point 84 on section 82), the measured ISD assumes a second value (e.g., about 3 nA), which is different from that of the first value.

In some embodiments, the change in phase of SAM 55, which is indicated by different ISDs measured when applying the same VSD to the S/D, may be used for performing data storage operations in memory cell 22, as will be described in detail herein.

In some embodiments, controller 11 is configured to alter the phase transition voltage by applying a suitable VG to gate electrode 33. In the present example, when controller 11 applies VG of about 1 V, the phase transition in SAM 55 is carried out at VSD of about 1.5 V rather than at about 1.8 V as described above.

As described in FIG. 3 above, the polaronic effect in MMs 66 located in close proximity to gate electrode 33 (e.g., in MC 67d) may be larger compared to that in MMs 66 located farther from gate electrode 33 (e.g., in MC 67c).

In some embodiments, when applying marginal VGs and/or VSDs, the phase change may occur in some MMs 66 (e.g., in MC 67d) and may not occur in other MMs 66 (e.g., in MC 67c). In other words, in some cases the phase change may occur in one or more MMs 66 but not in all MMs 66 of SAM 55, and the measured ISD may alter accordingly.

In some embodiments, controller 11 is configured to write or refresh a given data value in memory cell 22 by (i) applying a given VG (e.g., of about 1 V) and (ii) applying a VSD that is larger than a defined threshold of the VSD. In the present example, in response to applying VG of about 1 V, the defined threshold is about 1.5 V. In such embodiments, applying a VSD of about 1.7 V is larger than the defined threshold and results in a phase transition in one or more MMs 66, and typically in all MMs 66 of SAM 55. This operation is also referred to herein as a "gate on" operation, and the phase change in at least part of SAM 55, enables to write or refresh the given data value in memory cell 22.

In some embodiments, after the writing or refreshing operation described above, the second phase of SAM 55 is retained for a given time interval, e.g., between about 0.1 millisecond (msec) and 1 second (sec), and the ISD measured in S/D is indicative of the present phase of SAM 11 as described above. In some embodiments, after the given time interval, at least part of and typically all MMs 66 of SAM 55 return to assume the first phase.

In some embodiments, the example given time interval depends, inter alia, on the materials in use, the molecular structure (e.g., molecule-arrangement) and the size of SAM 55.

In the example of graph 70, when controller 11 applies to gate electrode 33 VG of about 1 V and to the S/D a VSD slightly smaller than about 1.7 V, SAM 55 still assumes the first phase, and the measured ISD is about 1.5 nA as shown in a point 79 that falls on section 72 of hysteresis loop 78. Subsequently, controller 11 applies to gate electrode 33 VG of about 1 V, and to the S/D a VSD slightly larger than about 1.7 V, so that at least part of SAM 55 assumes the second phase, and the measured ISD is about 4 nA, as shown in a point 89 that falls on section 82 of hysteresis loop 78. Note that due to the transition of SAM 55 from the first phase to the second phase, the ISD measured in response to applying almost the same VSD is substantially different compared to the ISD measured in point 79. In other words, the measured ISD is indicative of the phase change, which is indicative of writing or refreshing the aforementioned given data value in memory cell 22.

In some embodiments, controller 11 is configured to read the given data value from memory cell 22 by: (i) applying the given VG, (ii) applying a VSD that is smaller than the defined threshold of the VSD, and (iii) measuring a current, which is indicative of the given data value written in the memory cell as described above. In the present example, the applied VG has a voltage of about 1 V, the threshold is about 1.5 V, and the VSD applied for reading the given data is about 1.4 V, which is smaller than the defined threshold of about 1.5 V. As shown in graph 70, when SAM 55 assumes the first phase, the ISD measured by controller 11 is about 1 nA (shown in point 74), and when SAM 55 assumes the second phase, the ISD measured by controller 11 is about 3 nA (shown in point 84). This operation is also referred to herein as a "gate standby."

As described in the "gate on" operation (i.e., writing and/or refreshing), the second phase of SAM 55 is retained for the given time interval (e.g., between about 0.1 msec and 1 sec). Thus, if the gate standby operation is carried out by controller 11 within the given time interval after the gate on operation, the measured ISD is indicative of whether SAM 55 assumes the first phase (e.g., measured ISD of about 1 nA), or the second phase (e.g., measured ISD of about 3 nA). In case the gate standby operation is carried out by controller 11 subsequent to the given time interval (e.g., more than 1 sec) after the completion of the gate on operation, SAM 55 already assumes only the first phase and the measured ISD is typically about 1 nA.

In some embodiments, controller 11 is configured to erase the given data value from memory cell 22 by applying (i) a different VG, e.g., about −1 V, or any other suitable VG having a polarity opposite to that of the about 1 V given VG, or (ii) a different VSD, e.g., about −1.7 V or −1.8 V, or any other suitable VSD having a polarity opposite to that of the about 1.7 V VSD used for the writing or refreshing. This operation is also referred to herein as a "gate off" in which the phase of the SAM is altered.

In some embodiments, if the gate off operation is carried out by controller 11 within the given time interval after the gate on operation, controller 11 may erase the given data value. For example, if the given data value is produced by changing the first phase of at least part of SAM 55 to the second phase, the gate off operation erases the given data value by assuming back the first phase to SAM 55. After the given time interval, SAM 55 may return from the second phase to the first phase without the gate off operation.

In other words, based on the example embodiments described above, controller 11 is configured to: (i) write and/or refresh a data value in memory cell 22 by applying to gate electrode 33 VG of about 1 V, and to the S/D VSD larger than about 1.5 V (e.g., about 1.7 V), (ii) read the data value by applying to gate electrode 33 VG of about 1 V, and to the S/D VSD larger than Voff and smaller than the 1.5 V threshold (e.g., about 1.4 V), and (iii) erase the data value by applying to gate electrode 33 VG of about −1 V, and to the S/D VSD of about 1.4 V, or by applying to gate electrode 33 VG of about 1 V, and to the S/D VSD of about −1.7 V, or by applying to gate electrode 33 and to the SID any other suitable VG and/or VSD, respectively, having opposite polarity to that applied during the gate on operation described above.

In some embodiments, memory device 10 may be implemented in any suitable type of computerized system, such as in a high-speed communication system. Note that in a given communication system having processors and controllers operating at frequencies on the order of GHz, the aforementioned time intervals, e.g., between about 0.1 msec and 1 sec, are sufficient to carry out the gate on, gate standby and gate off operations described above well before SAM 55 may automatically return from assuming the second phase to assume the first phase.

This particular graph of hysteresis loop 70 is shown by way of example, in order to illustrate certain problems in data storage that are addressed by embodiments of the present invention and to demonstrate the application of these embodiments in enhancing the performance of such a memory cell and/or memory device. Embodiments of the present invention, however, are by no means limited to this specific sort of example hysteresis loop, and the principles described herein may similarly be applied to other sorts of memory cells or devices having other sorts of hysteresis loops, which may differ from hysteresis loop 70 by shape and/or electrical values (e.g., voltage and/or current), or by any other attribute.

Figure 5:
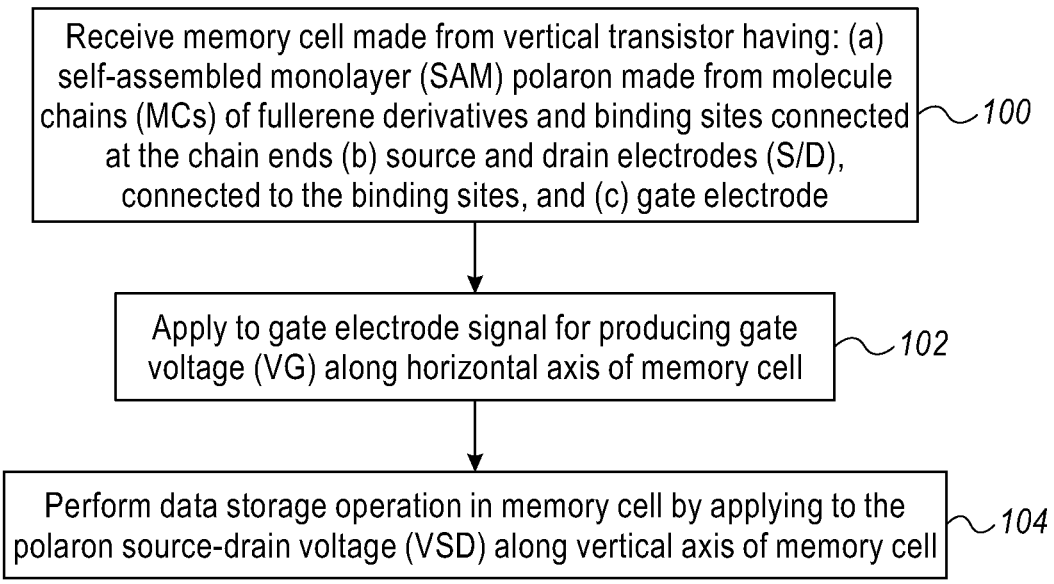
FIG. 5 is a flow chart that schematically illustrates a method for performing data storage operations in the memory cell, in accordance with an embodiment of the present invention.

FIG. 5 is a flow chart that schematically illustrates a method for performing data storage operations in memory cell 22, in accordance with an embodiment of the present invention. The method begins at a memory device receiving step 100, with receiving controller 11 and memory 12 having one or more memory cells 22. As described in detail in the example of FIG. 2 above, each memory cell 22 is implemented in a vertical transistor comprising: (a) a self-assembled monolayer (SAM) polaron, in the present example SAM 55, which is made from one or more MCs 67. Each MC 67 comprises a linear MM 66 having one or more FDs 77, and binding sites 88 connected to the ends of MM 66, (b) source 44 and drain (also denoted S/D or S/D electrodes) electrically connected to binding sites 88, and (c) gate electrode 33 and GD 34.

At a gate voltage application step 102, controller 11 applies to gate electrode 33 a signal for producing gate voltage (VG) applied along direction 40, which is parallel to a horizontal axis (X-axis in the example of FIG. 2 above) of memory cell 22, as described in detail in FIGS. 2-3 above.

At a data storing step 104 that concludes the method, controller 11 performs one or more data storage operations in memory cell 22 by applying to SAM 55, via S/D electrodes, source-drain voltage (VSD) along a vertical axis (Z-axis in the example of FIG. 2 above) of memory cell 22.

In some embodiments, during the gate on operation (e.g., refreshing and/or writing data values into memory cell 22) and the gate off operation (e.g., erasing data values from memory cell 22), controller 11 applies suitable values of VG and VSD.

In some embodiments, during the gate standby operation (e.g., reading data values from memory cell 22), in addition to the application of suitable VG and VSD as described above, controller 11 measures ISD in the S/D electrodes. In some embodiments, the measured ISD is indicative of the data value written in memory cell 22, which also corresponds to the present phase assumed by SAM 55, as described in detail in FIGS. 2-4 above.

This particular method for performing data storage operations in memory cell 22 is simplified and shown by way of example, in order to illustrate certain problems that are addressed by embodiments of the present invention and to demonstrate the application of these embodiments in enhancing the performance of such a memory cell and memory device. Embodiments of the present invention, however, are by no means limited to this specific sort of example method applied to the example transistor structure and memory cell and memory device described in FIGS. 1-4 above, and the principles described herein may similarly be applied other suitable methods of data storage operations that may be applied to the present examples of memory cell and memory device described in FIGS. 1-4 above, and to other sorts of suitable transistors or other structures, memory cells and memory devices.

Figure 6:
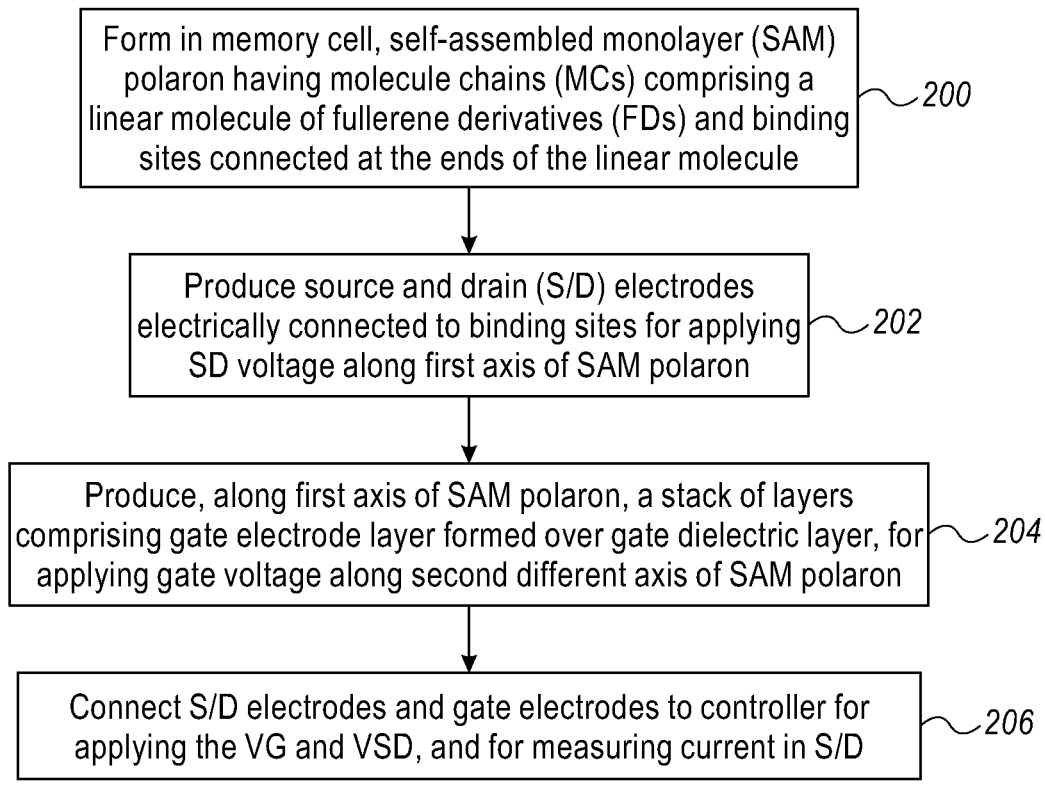
FIG. 6 is a flow chart that schematically illustrates a method for producing a memory cell, in accordance with an embodiment of the present invention.

FIG. 6 is a flow chart that schematically illustrates a method for producing memory cell 22 of memory device 10, in accordance with an embodiment of the present invention.

The method begins at a polaron formation step 200, with forming in memory cell 22, SAM 55, which comprises a self-assembled monolayer polaron having MCs 67. Each MC 67 comprising (i) MM 66 made from a linear molecule comprising one or more fullerene derivatives (FDs) 77 and having two ends, and (ii) binding sites 88 connected at the ends of each MM 66. The structure of SAM 55 is described in detail in FIG. 2 above.

At a S/D-electrodes production step 202, source 44 and drain 45 (i.e., S/D electrodes) are produced using any suitable technique, such as but not limited to very large-scale integration (VLSI) production processes. Source 44 and drain 45 are electrically connected to binding sites 88 for applying VSD along a first axis of SAM 55, corresponding to the Z-axis of memory cell 22 in the example of FIG. 2.

At a gate formation step 204, a stack of layers comprising gate electrode 33 formed over gate dielectric 34, are produced along the Z-axis of SAM 55 and memory cell 22. Gate electrode 33 is formed for applying to SAM 55 gate voltage (VG) along the X-axis of SAM 55 and memory cell 22.

In some embodiments, memory cell 22 is produced such that VG and VSD are applied in different directions 40 and 30, respectively. In the present example, directions 40 and 30 are orthogonal to one another, as described in detail in FIG. 2 above.

At an electrode connecting step 206 that concludes the method, source 44 and drain 45, and gate electrode 33 are electrically connected to controller 11 for applying the VG and VSD to SAM 55 so as to perform data storage operations in memory cell 22, and for measuring current in S/D (ISD), which is indicative of the data value stored in memory cell 22.

The production method of FIG. 6 is simplified for the sake of conceptual clarity and is provided by way of example. In other embodiments, SAM 55 may be received from any suitable supplier so that step 200 may be removed from the production method, or alternatively, be replaced with a receiving step of SAM 55.

Additionally or alternatively, the production method of SAM 55, which is described in essence in step 200, may comprise an independent method for producing a self-assembled monolayer polaron. Moreover, the techniques disclosed is FIGS. 2, 3 and 6, may be used, mutatis mutandis, for producing other suitable sorts of polarons and/or other sorts of phase-changed memory (PCM) materials and/or structures that may be used for producing memory devices, such as memory device 10 and memory 10.

In some embodiments, SAM 55 or any other suitable type of SAM polaron or PCM material, may be implemented, mutatis mutandis, in any suitable type of structure producing using VLSI process flows or any other suitable process flows. For example, SAM 55 may be implemented in a vertical fin field-effect transistor (finFET), in a horizontal metal-oxide-semiconductor FET (MOSFET) transistor, in a vertical gate-all-around (GAA) transistor, which is based on nano-wires or nano-sheets, or in any other suitable structure, as described in FIG. 2 above.

Although the embodiments described herein mainly address a volatile memory device, such as a capacitor-less dynamic random-access memory (DRAM), also denoted in the semiconductor industry as a Z-RAM, the methods and systems described herein can also be used in other applications, such as in all types of memory devices and in memory-computation hybrid devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory device, comprising:
   a memory cell, comprising:
      an array of one or more molecule chains, at least one of the molecule chains comprising: (i) first and second binding sites positioned at first and second ends of the molecule chain, respectively, and (ii) a chain of one or more fullerene derivatives, chemically connecting between the first and second binding sites;
      a source electrode and a drain electrode, which are electrically connected to the first and second binding sites, respectively, and are configured to apply to the array a source-drain voltage (VSD) along a first axis; and
      a gate electrode, which is configured to apply to the array a gate voltage (VG) along a second axis, different from the first axis; and
   a controller, which is configured to perform a data storage operation in the memory cell by (i) applying to the gate electrode a signal for producing the VG, and (ii) applying the VSD between the source and drain electrodes.

2. The memory device according to claim 1, wherein at least one of the binding sites comprises a thiol or a carboxyl group bonded to one or more titanium-oxide or aluminum oxide compounds.

3. The memory device according to claim 1, wherein at least one of the fullerene derivatives comprises a C60 fullerene having a polyhedral carbon structure.

4. The memory device according to claim 1, wherein the array of the one or more molecule chains comprises a self-assembled monolayer (SAM).

5. The memory device according to claim 4, wherein the controller is configured to write a data value to the memory cell, or to erase the data value from the memory cell, by changing a phase of at least part of the SAM.

6. The memory device according to claim 4, wherein the molecules of the array are interconnected by chemically connecting between adjacent molecule chains of the SAM.

7. The memory device according to claim 1, wherein the controller is configured to write or refresh a data value in the memory cell by (i) applying a given VG and (ii) applying the VSD that is larger than a defined threshold of the VSD.

8. The memory device according to claim 7, wherein the controller is configured to read the data value from the memory cell by (i) applying the given VG, (ii) applying the VSD that is smaller than the defined threshold of the VSD, and (iii) measuring a current indicative of the data value written in the memory cell.

9. The memory device according to claim 8, wherein at least one of the molecule chains in the array has a hysteresis loop, and wherein, when applying the given VG: (i) in response to writing or refreshing the data value, the molecule chain assumes a first phase and the measured current assumes a first value, and (ii) without writing or refreshing the data value, the molecule chain assumes a second phase different from the first phase, and the measured current assumes a second value, smaller than the first value.

10. The memory device according to claim 7, wherein the controller is configured to erase the data value from the memory cell by applying (i) the VG having a polarity opposite to that of the given VG, or (ii) the VSD having a polarity opposite to that of the VSD used for the writing or the refreshing.

11. The memory device according to claim 1, wherein the controller is configured to apply the VG to the gate electrode using a light beam or an electrical voltage.

12. The memory device according to claim 1, wherein the chain comprises a predefined number of the fullerene derivatives, and wherein the predefined number is configured to determine an operational frequency of the memory device.

13. The memory device according to claim 1, wherein the memory cell comprises one or more additional arrays of the one or more molecule chains, each of the additional arrays is electrically connected to the source electrode and to the drain electrode, and wherein the controller is configured to perform the data storage operation in (i) the array and (ii) the one or more additional arrays at a same time.

14. The memory device according to claim 13, wherein a number of the one or more additional arrays determines a memory capacity of the memory cell.

15. A method, comprising:
in a memory cell, comprising: (a) an array of one or more molecule chains, at least one of the molecule chains comprising: (i) first and second binding sites positioned at first and second ends of the molecule chain, respectively, and (ii) a chain of one or more fullerene derivatives, chemically connecting between the first and second binding sites, (b) a source electrode and a drain electrode, which are electrically connected to the first and second binding sites, respectively, for applying to the array a source-drain voltage (VSD) along a first axis, and (c) a gate electrode for applying to the array a gate voltage (VG) along a second axis, different from the first axis, applying to the gate electrode a signal for producing the VG; and
performing a data storage operation in the memory cell by applying the VSD between the source and drain electrodes.

16. The method according to claim 15, wherein at least one of the binding sites comprises a thiol or a carboxyl group bonded to one or more titanium-oxide or aluminum oxide compounds.

17. The method according to claim 15, wherein at least one of the fullerene derivatives comprises a C60 fullerene having a polyhedral carbon structure.

18. The method according to claim 15, wherein the array of the one or more molecule chains comprises a self-assembled monolayer (SAM).

19. The method according to claim 18, wherein performing the data storage operation comprises writing a data value to the memory cell, or erasing the data value from the memory cell, by changing a phase of at least part of the SAM.

20. The method according to claim 18, wherein the molecules of the array are interconnected by chemically connecting between adjacent molecule chains of the SAM.

21. The method according to claim 15, wherein performing the data storage operation comprises writing or refreshing a data value in the memory cell by (i) applying a given VG and (ii) applying the VSD that is larger than a defined threshold of the VSD.

22. The method according to claim 21, wherein performing the data storage operation comprises reading the data value from the memory cell by (i) applying the given VG, (ii) applying the VSD that is smaller than the defined threshold of the VSD, and (iii) measuring a current indicative of the data value written in the memory cell.

23. The method according to claim 22, wherein at least one of the molecule chains in the array has a hysteresis loop, and wherein, when applying the given VG: (i) in response to writing or refreshing the data value, the molecule chain assumes a first phase and the measured current assumes a first value, and (ii) without writing or refreshing the data value, the molecule chain assumes a second phase different from the first phase, and the measured current assumes a second value, smaller than the first value.

24. The method according to claim 21, wherein performing the data storage operation comprises erasing the data value from the memory cell by applying (i) the VG having a polarity opposite to that of the given VG, or (ii) the VSD having a polarity opposite to that of the VSD used for the writing or the refreshing.

25. The method according to claim 15, wherein performing the data storage operation comprises applying the VG to the gate electrode using a light beam or an electrical voltage.

26. The method according to claim 15, wherein the chain comprises a predefined number of the fullerene derivatives, and wherein the predefined number is for determining an operational frequency of the memory device.

27. The method according to claim 15, wherein the memory cell comprises one or more additional arrays of the one or more molecule chains, each of the additional arrays is electrically connected to the source electrode and to the drain electrode, and wherein performing the data storage operation comprises performing the data storage operation in (i) the array and (ii) the one or more additional arrays at a same time.

28. The method according to claim 27, wherein a number of the one or more additional arrays determines a memory capacity of the memory cell.

* * * * *